(12) United States Patent
Wee

(10) Patent No.: US 9,054,735 B1
(45) Date of Patent: Jun. 9, 2015

(54) METHOD FOR ENCODING AND DECODING USING VARIABLE LENGTH CODING AND SYSTEM THEREOF

(71) Applicant: Fingram Co., Ltd, Suwon-si, Gyeonggi-do, Seoul (KR)

(72) Inventor: Young Cheul Wee, Suwon-si (KR)

(73) Assignee: Fingram Co., Ltd. (KR)

( * ) Notice: Subject to any disclaimer, the term of this patent is extended or adjusted under 35 U.S.C. 154(b) by 0 days.

(21) Appl. No.: 14/580,078

(22) Filed: Dec. 22, 2014

(30) Foreign Application Priority Data

Dec. 20, 2013 (KR) .......................... 10-2013-0160466

(51) Int. Cl.
*H03M 7/40* (2006.01)
*H04N 19/102* (2014.01)
*H03M 7/30* (2006.01)
*H04N 19/436* (2014.01)
*G06T 9/00* (2006.01)
*H04N 19/61* (2014.01)

(52) U.S. Cl.
CPC .......... *H03M 7/4093* (2013.01); *H04N 7/26106* (2013.01); *H03M 7/30* (2013.01); *H03M 7/40* (2013.01); *H04N 7/26755* (2013.01); *G06T 9/005* (2013.01); *H03M 7/4006* (2013.01); *H04N 7/50* (2013.01)

(58) Field of Classification Search
CPC ....... H03M 7/40; H03M 7/30; H03M 7/4006; G06T 9/005; H04N 7/50; H04N 7/26755; H04N 7/26106
USPC ...................... 341/67, 65, 106, 107; 375/240; 382/233, 234, 245, 246
See application file for complete search history.

(56) References Cited

U.S. PATENT DOCUMENTS

2012/0092197 A1* 4/2012 Harada et al. ................... 341/67

* cited by examiner

*Primary Examiner* — Joseph Lauture
(74) *Attorney, Agent, or Firm* — Knobbe, Martens, Olson & Bear LLP

(57) ABSTRACT

A method for encoding using a variable length coding is provided, which includes at an encoding system, determining variable length codes for coding a data set to be encoded, dividing a corresponding code corresponding to a specific data included in the data set into a first partial code and a second partial code and storing the divided first and second partial codes at the encoding system, and compressing a first partial code, which is a set of the first partial code, and storing the compressed result at the encoding system.

12 Claims, 11 Drawing Sheets

METHOD FOR ENCODING AND DECODING USING VARIABLE LENGTH CODING AND SYSTEM THEREOF

CROSS-REFERENCE TO RELATED APPLICATION

The present application claims priority to Korean Patent Application No. 10-2013-0160466, filed Dec. 20, 2013, which is incorporated herein by reference in its entirety.

FIELD

The present disclosure relates to encoding and decoding of data. More particularly, the disclosure relates to coding and encoding using variable length coding.

BACKGROUND

Variable length coding is well known in the art. The variable length coding is widely employed in various fields including compression of images or image frames etc.

The variable length coding (e.g., Huffman Coding) is a coding method in which frequently appearing symbols are (en)coded using short length (bit length) codes, while the other symbols that do not frequently appear are coded using relatively longer length codes so that the overall length of coded data may be shorter than that of data before coded.

It is well known that there are various variable length coding methods. An exemplary embodiment among the various variable length coding methods will be explained herein with reference to FIG. 1.

FIG. 1 is a diagram provided to explain the conventional variable length coding.

Referring to FIG. 1, when a data set (e.g., $D_1$ to $D_n$) is specified, an encoding system may determine variable length codes to be applied for the variable length coding of the data set.

Various methods are known that determine the variable length codes corresponding to the data set (e.g., $D_1$ to $D_n$).

For example, the encoding system m may determine a one-bit code (e.g., 1) as a first code corresponding to a first symbol (e.g., $S_1$) included in the data set (e.g., $D_1$ to $D_n$), and a two-bit code (e.g., 01) as a second code corresponding to a second symbol (e.g., $S_2$). Further, the encoding system may determine a third, a fourth and a fifth codes (e.g., 001, 0001, 0000) for a third, a fourth and a fifth symbols (e.g., $S_3$, $S_4$ and $S_5$), respectively.

When the variable length codes (e.g., the first code to the fifth code) are determined as described above, the encoding system may obtain encoded code data (e.g., $C_1$ to $C_n$) by storing each data included in the data set (e.g., $D_1$ to $D_n$) as corresponding code (e.g., one of first to fifth codes). The encoded code data (e.g., $C_1$ to $C_n$) is represented by a set of the variable length codes.

The variable length coding is advantageous in that frequently appearing symbols are replaced by relatively shorter-length codes so that it is possible to obtain the code data (e.g., $C_1$ to $C_n$) in a length that is compressed in comparison with the length of the original data set (e.g., $D_1$ to $D_n$).

Generally, in the area which is not complicated ("flat area") of an image (or an image frame), pixels having similar values often consecutively appear. Therefore, when an image is encoded using a predetermined method, in the case of a flat area, probability is high that the frequently appearing symbols consecutively exist together. Further, the frequently appearing symbols may be represented by the codes having a short length when performing the variable length coding.

Such a characteristic may appear when encoding various data (e.g., documents, text and the like) as well as an image.

The discussion in this section is only to provide background for the understanding of the invention and does not constitute an admission of prior art.

SUMMARY

One aspect of the present invention provides a method for encoding data comprising a sequence of data sets using a plurality of different codes having the shortest code and longer codes that are longer than the shortest code. Each of the longer codes comprises a leading portion that is in the same length as the shortest code and a trailing portion that is the remainder following the leading portion in each of the longer codes. The method comprises assigning to each data set, one of the plurality of codes to provide a first sequence of codes representing the sequence of data sets. To provide first sequence of codes, the shortest code is assigned to the most repeated data set in the sequence of data sets. The method comprises generating a second sequence comprising the shortest code and leading portions of the longer codes appearing in the first sequence, wherein the shortest code and the leading portions in the second sequence are ordered such that each of the shortest code and the leading portions in the second sequence sequentially corresponds to each code of the first sequence of codes such that more repeated patterns are found in the second sequence than in the first sequence, wherein the shortest code appearing in the second sequence represents the same shortest code appearing in the first sequence, wherein each leading portion appearing in the second sequence represents a longer code of the first sequence that the leading portion originates. The method also comprises generating a third sequence comprising trailing portions of the longer codes appearing in the first sequence, wherein the trailing portions in the second sequence are ordered such that each of the trailing portions in the second sequence sequentially corresponds to each longer code of the first sequence of codes, wherein each trailing portion appearing in the second sequence represents a longer code of the first sequence that the leading portion originates. The method comprises compressing the second sequence using a data compression software module.

In the foregoing method, to generate the second sequence, leading portion in a predetermined length can be identified and extracted from each code in the first sequence of codes. To obtain the second sequence, the (extracted) leading portion can be arranged in accordance with the order of its corresponding code from which the leading portion is extracted in the first sequence. Consequently, the leading portions arranged in the second sequence are ordered such that each of the leading portions in the second sequence sequentially corresponds to each code of the first sequence of codes. The predetermined length to extract the leading portion can be same as or shorter than the length of the shortest code for obtain more repeated patterns in the second sequence than in the first sequence.

In the some embodiments of the present invention, the second sequence of the of codes can be obtained after assigning a plurality of different codes are without generating a separate (first) sequence of codes. The second sequence of codes can be generated directly from a sequence of data sets when the different codes (variable length codes) are identified for encoding the sequence of data sets.

In the present disclosure, the term "a plurality of different codes" recited in the foregoing method may also be referred to as variable length codes. In the foregoing method, the shortest code has the shortest length of code among the plurality of codes.

In the foregoing method, another shortest code that has the same length as the shortest code can be assigned to a data set. In the present disclosure, the term "the shortest code" may also be referred to as the 'least' code.

Another aspect of the present invention provides a method for encoding data using a variable length coding. The method comprises determining variable length codes for coding a data set to be encoded at an encoding system; dividing a corresponding code, which is one of the variable length codes, corresponding to a specific data included in the data set into a first partial code and a second partial code and storing the divided first and second partial codes; and compressing a first partial code set, which is a set of the first partial code, and storing the compressed result. In the foregoing method, wherein the first partial code is at least a part of the corresponding code, which corresponds to a length of a least code having a minimum code length among the variable length codes. In some embodiments of the foregoing method, the first partial code is a most significant 1 bit of the code. The foregoing method can further comprise determining the variable length codes, at the encoding system, determining whether a minimum code length is a predetermined reference length or not; and performing the steps of dividing the corresponding code and the step of compressing a first partial code set only when a result of the determining indicates that the minimum code length is the reference length. The foregoing method also comprises dividing the second partial code included in the second partial code set into a third partial code and a fourth partial code and storing the divided partial codes; and compressing and storing a third partial code set of the third partial code.

Another aspect of the present invention provides a method for decoding a code data set which is an encoded data set, using a variable length coding. The method for decoding a code data set comprises, decompressing a first partial code set included in the code data set, the code data set including the first partial code set and a second partial code set and the first partial code set being compressed and stored at a decoding system; acquiring a first partial code of a corresponding code that corresponds to a specific data from the decompressed first partial code set and acquiring a second partial code, which is rest of the corresponding code, from the second partial code set at the decoding system; and combining the acquired first partial code and second partial code to acquire the corresponding code at the decoding system. In certain embodiments of the foregoing method for decoding a code data set, when the second partial code is combined with the first partial code, the step of acquiring a second partial code, which is rest of the corresponding code, from the second partial code set can comprise extracting bits included in the second partial code one by one from the second partial code set until combined code, which is combined of the first partial code and the extracted bits, is one of the variable length codes. In the foregoing method for decoding a code data set, the step of acquiring a second partial code, which is rest of the corresponding code set, can comprise decompressing a third partial code set included in the second partial code set, the second partial code set including the third partial code set and a fourth partial code set and the third partial code set being compressed and stored; acquiring a third partial code of a specific second partial code from the decompressed third partial code set, and acquiring a fourth partial code that is rest of the specific second partial code from the fourth partial code set at the decoding system; and combining the acquired the third partial code and the fourth partial code to acquire the specific second partial code at the decoding system.

Another aspect of the present invention provides a method for decoding a code data set. which is an encoded data set, using a variable length coding, can comprise, at a decoding system, acquiring a first partial code from a first partial code set of the code data set which is divided into the first partial code set and a second partial code set, and if the acquired first partial code is one of variable length codes, determining the first partial code to be a corresponding code that corresponds to a specific data; and if the acquired first partial code is not one of the variable length codes, and when the second partial code is combined with the first partial code, extracting bits included in the second partial code one by one from the second partial code set until combined code, which is combined of the first partial code and the extracted bits, is one of the variable length codes, and determining the combined code to be the corresponding code.

Another aspect of the present invention provides an encoding system for performing a code dividing and storing process using a variable length coding. The encoding system comprises a code determining module configured to determine variable length codes for coding a data set; and a coding module configured to store a corresponding code that corresponds to a specific data included in the data set. In certain embodiments of the foregoing encoding system, the coding module divides the corresponding code into a first partial code and a second partial code and stores the divided result, and performs a code dividing and storing process in which the coding module compresses a first partial code set of the first partial code and stores the compressed result. In certain embodiments of the foregoing encoding system, the first partial code is at least a part of the corresponding code which corresponds to a length of a least code having a minimum code length among the variable length codes, or is a most significant 1 bit of the corresponding code. In certain embodiments of the foregoing encoding system, the coding module performs the code dividing and storing process only when the length of a least code having a minimum code length among the variable length codes as determined by the code determining module is a predetermined reference length. In certain embodiments of the foregoing encoding system, the coding module divides a second partial codes included in the second partial code set into a third partial code and a fourth partial code and stores the divided partial codes, and further performs a second code dividing and storing process in which the coding module compresses a third partial code set of the third partial code and stores the compressed result.

Another aspect of the present invention provides an decoding system for decoding a code data set which is an encoded data set, using a variable length coding. The foregoing decoding system comprises a code data acquisition module configured to acquire a code data from the code data set; and a decoding module configured to decode the code data acquired by the code data acquisition module. In certain embodiments of the foregoing decoding system, the code data acquisition module decompresses a first partial code set included in the code data set, the code data set including the first partial code set and a second partial code set, acquires a first partial code of a corresponding code that corresponds to a specific data from the decompressed first partial code set, and acquires a second partial code which is rest of the corresponding code from the second partial code set, and combines the acquired first partial code and second partial code to acquire the corresponding code.

Another aspect of the present invention provides an decoding system for decoding a code data set which is an encoded data set, using a variable length coding. The decoding system comprises, a code data acquisition module configured to acquire a code data from the code data set; and a decoding module configured to decode the code data acquired by the code data acquisition module. In certain embodiments of the foregoing decoding system, the code data acquisition module acquires a first partial code from the first partial code set of the code data set which is divided into the first partial code set and a second partial code set, if the acquired first partial code is one of the variable length codes, determines the first partial code to be a corresponding code that corresponds to a specific data, if the acquired first partial code is not one of the variable length codes, and when the second partial code is combined with the first partial code, extracts bits included in the second partial code one by one from the second partial code set until combined code, which is combined of the first partial code and the extracted bits, is one of the variable length codes, and determines the combined code to be the corresponding code.

In accordance with an embodiment of the present invention, it is possible to obtain relatively high compression rate by dividing each code into at least two sets of partial codes, storing the divided partial codes and compressing the same rather than using the code data itself to be obtained through the variable length coding.

Further, when dividing each code using minimum code length of the variable length codes, there is a high probability that the bits having the same value consecutively appear in the set of partial codes which is set of the most significant bit (MSB) side among the sets of partial codes which each code is divided. Accordingly, it is possible to compress the set of partial codes which is set of the MSB side with a high compression rate.

Particularly, simulation result indicates that, when the minimum code length is '1', that is, when there is a code having a length of 1 bit among the variable length codes, it is possible to obtain a remarkably enhanced compression rate by performing processes of dividing and storing the codes according to a technical concept of the embodiments, compared with the conventional variable length coding method.

BRIEF DESCRIPTION OF THE DRAWINGS

The above and other objects and features of the present invention will become apparent from the following description of the embodiments given in conjunction with the accompanying drawings, in which.

DETAILED DESCRIPTION OF EMBODIMENTS

Figure 1:
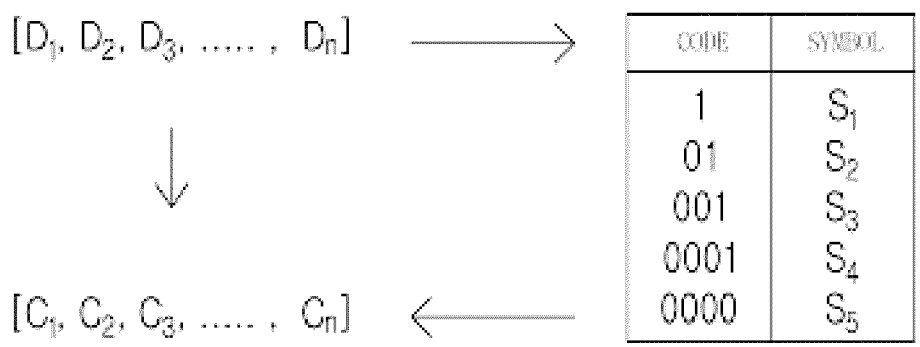
FIG. 1 is a diagram for illustrating a variable length coding in the related art.

To fully understand the purpose achieved by the embodiments of the present invention and operational advantages thereof, reference is made to the appended drawings illustrating preferred embodiments of the present invention and also to the contents shown in the drawings.

Further, in the present specification, when an element "transmits" a data to another element, it means that the element may transmit the data directly to another element, or to another element via one or more of yet another elements.

On the contrary, when one element "directly transmits" a data to another element, it means that the data is transmitted from the one element to another element without passing yet another element.

Hereinafter, the embodiments of the present invention will be described in detail with reference to the accompanying drawings. Like reference numerals refer to like elements throughout the specification.

Figure 2:
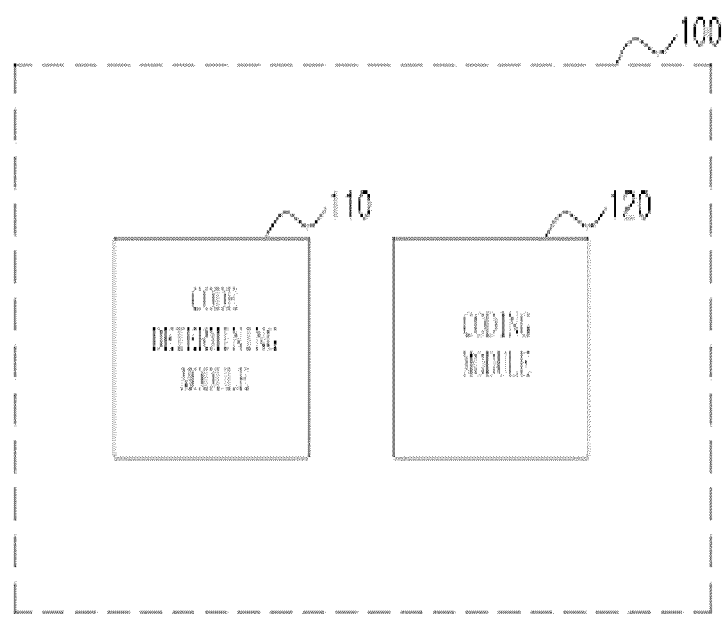
FIG. 2 is a schematic diagram of an encoding system in accordance with an embodiment of the present invention.

FIG. 2 is a schematic diagram of an encoding system in accordance with an embodiment of the present invention.

Referring to FIG. 2, an encoding system 100 in accordance with an embodiment of the present invention includes a code determining module 110 and a coding module 120.

The encoding system 100 may be a system for compressing images or videos, although not limited thereto.

The encoding system 100 may be implemented as a data processing device (e.g., a computer, or a mobile terminal), and may be implemented on the basis of a close combination of a hardware provided in the data processing device and a predetermined software configured to implement the technical concept of the embodiments.

The expression 'module' as used herein may refer to a functional and structural combination between hardware to implement the technical concept of the embodiments and software to drive the hardware. For example, the expression 'module' may refer to a logical unit of a predetermined code and hardware resource to implement the predetermined code, and those with ordinary skill in the art may easily understand that expression 'module' may not always refer to physically connected codes or only one kind of hardware.

Depending on embodiments, the encoding system 100 may be installed on not only a single physical device, but also a plurality of physical devices in a distributive manner. That is, depending on needs, the elements included in the encoding system 100 may be implemented as independent physical device, respectively, in which case each of the physical devices may be closely connected through a wired/wireless network to implement the encoding system 100 in accordance with the technical concept of the embodiments.

The code determining module 110 may determine variable length codes corresponding to a data set to be encoded.

For example, the code determining module 110 may determine the variable length codes according to the frequency the symbols appear in the data set. Further, the code determining module 110 may determine the shorter length codes for the more frequently appearing symbols, and the longer code for the less frequently appearing symbols. Since the method for determining the variable length codes according to the variable length coding (e.g., Huffman coding) is already widely known, this will not be explained in detail below for the sake of brevity.

Once the variable length codes are determined by the code determining module 110, the coding module 120 may code each data included in the data set into any of the variable length codes.

In accordance with the technical concept of the embodiments, the coding module 120 may determine a code corresponding to a specific data, and divide the determined code into at least two partial codes and store the divided partial codes. The coding module 120 may divide and store the code corresponding to each of the data included in the data set in the same manner.

In accordance with an embodiment, the coding module 120 may divide in a manner such that a predetermined number of high order bits of the code are divided as a first partial code and the rest bits of the code are divided as a second partial code.

Further, the second partial code may not exist depending on an embodiment. That is, the first partial code may be the code itself.

Depending on embodiments, the second partial code may be divided into a third and a fourth partial codes, which will be explained below with reference to FIGS. 7A and 7B.

As mentioned above, the coding module 120 may divide each code into at least two partial codes and store the divided partial codes. The first partial code may be separated from the code so that the same values may consecutively appear in a first partial code set in which the first partial codes are included.

To this end, the coding module 120 may divide the first partial code for a length that corresponds to a minimum code length among the variable length codes. In one embodiment, the minimum code length may be '1'.

That is, the coding module 120 may determine the variable length codes, and if there exists a code having a length of '1' (i.e., 1 bit) among the determined variable length codes, the coding module 120 may perform a code dividing and storing process in which each code is divided into the first partial code and the second partial code and stored.

In accordance with an embodiment, the coding module 120 may perform the code dividing and storing process as described above only when the minimum code length of the variable length codes is '1', and may store a sequence of the code data as it is, when the minimum code length is larger than '1' as in the conventional variable length coding method.

Alternatively, in accordance with another embodiment, the coding module 120 may perform the code dividing and storing process even when the minimum code length of the variable length codes is larger than '1'. However, as a result of simulation, it was revealed that the compression rate of the first partial code set of the first partial codes was considerably lower than the case that the minimum code length is '1'.

Hereinafter, embodiments will be explained with reference to the case that the minimum code length is '1', but it should be noted that the scope of the present invention may also be applied to the case that the minimum code length is larger than '1'.

The presence of the minimum code length '1' of the variable length codes, that is, the presence of a least code having a 1-bit length (e.g., code value of 1 or 0) may represent that a symbol corresponding to the least code appears substantially more frequently than the other symbols. Therefore, when coding the data (i.e., the symbol) included in the data set, each coded code is the least code or non-least codes, and the most significant bit (MSB) of each code is the least code itself (e.g., when the least code is '1') or has the non-least code value (e.g., '0'). Accordingly, the least code appears more frequently than the non-least codes, and probability increases that the least code consecutively appears.

That is, in the first partial code set which has only the MSB of the respective codes included in the code data coded through the variable length coding, the least code (e.g., 1) appears relatively frequently and each MSB of the non-least codes is represented by the value (e.g., '0') which is different from the least code. Further, there is high probability that the least code consecutively appears in the first partial code set. Particularly, when encoding images (or videos), there is high probability that the least codes are intensively coded in pixels corresponding to the flat area of the image. Accordingly, for example, when the least code is '1', the first partial code set may be a data set in which '1' consecutively frequently appears and the rest codes are '0'. Further, as is well known, when the same values consecutively frequently appear as described above, the compression rate may be relatively high.

In conclusion, in accordance with the technical concept of the embodiments, the coding module 120 of the encoding system 100, while performing the coding using the variable length coding to code each data included in the data set into each code included in the variable length codes, may divide each code into the first and second partial codes, and store the divided first and second partial codes. Further, the first partial code set of the first partial codes has a high probability that the same values consecutively appear therein. Therefore, when the first partial code set is compressed again by a predetermined method, the compression rate of the first partial code set may be relatively increased. Particularly, when the first partial code is the MSB of each code, that is, when the length of the least code among the variable length codes is 1 bit, the compression rate of the first partial code set can be enhanced remarkably.

Of course, the code dividing and storing process for dividing respective codes and storing the divided codes may be performed as described above even when the length of the least code is not '1'. In this case, the high order bits corresponding to the length of the least code, i.e., to the minimum code length may be divided from the respective codes as the first partial code.

Further, depending on embodiments, 1-bit MSB of each code may be simply divided as the first partial code even when the length of the least code is not '1'. Even in this case there is no loss of compression rate.

Figure 3:
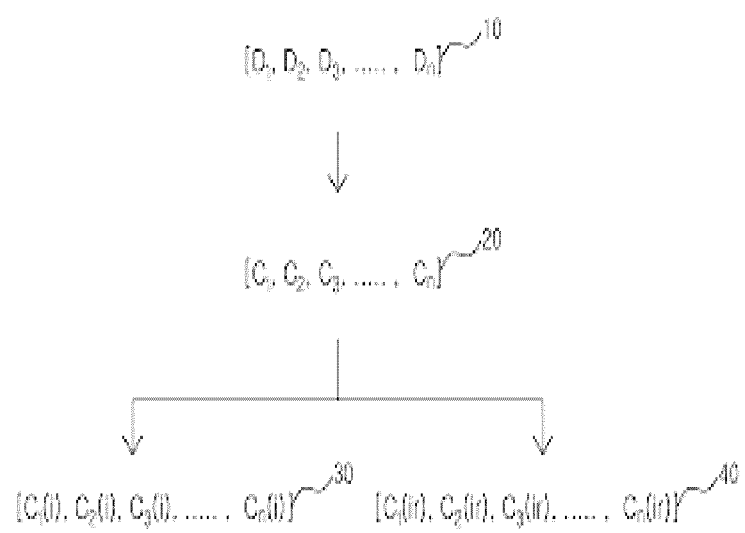
FIGS. 3 and 4 are diagrams for illustrating processes of implementing a method for encoding in accordance with an embodiment of the present invention.
Figure 4:
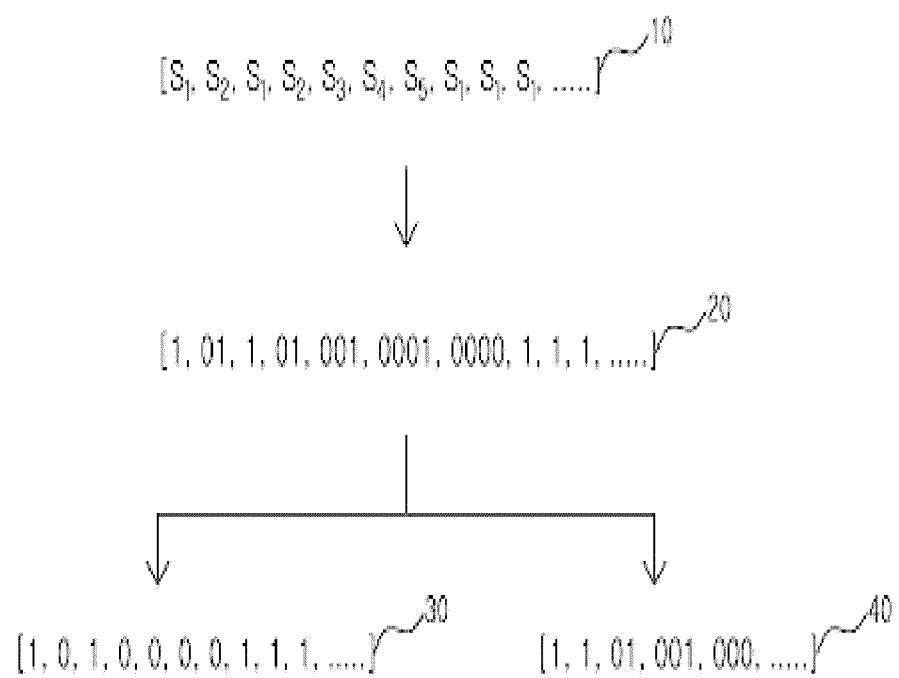

FIGS. 3 and 4 are diagrams provided to explain processes of a method for encoding in accordance with an embodiment.

Referring to FIG. 3, a predetermined data set (e.g., $D_1$ to $D_n$, 10) may be input from outside or calculated by the encoding system 100. The code determining module 110 may then determine the variable length codes for use in coding of the data set 10. It is assumed that the determined variable length codes are those that are shown in FIG. 1.

The coding module 120 may then determine the code data (e.g., $C_1$ to $C_n$, 20) corresponding to the data set 10. The predetermined code $C_n$ included in the code data may be a code corresponding to the predetermined data $D_n$ included in the data set 10. Conventionally, the code data 20 itself is output as a result of encoding or the code data 20 is compressed by a predetermined method to output encoding result.

However, in accordance with the technical concept of the embodiments, the coding module 120 may divide the code data 20 into the first partial code set (e.g., $C_1(i)$ to $C_n(i)$, 30) and the second partial code set (e.g., $C_1(ir)$ to $C_n(ir)$, 40), and store the divided partial codes. As used herein, $C_n(i)$ may represent i number of high order bits of (n)th code. Further, as described above, T may be '1'. Furthermore, $C_n(ir)$ may represent the rest bits other than the i number of high order bits of the (n)th code.

When the first partial code set 30 is divided as mentioned above, the compression rate can be further increased than the case the code data 20 is compressed. Of course, the second partial code set 40 also may be compressed and stored.

The processes shown in FIG. 3 will be described in greater detail below with reference to FIG. 4.

As illustrated in FIG. 4, a sequence of symbols (e.g., $S_1$, $S_2$, $S_1$, $S_2$, $S_3$, $S_4$, $S_5$, $S_1$, $S_1$, $S_1$ and so on) may be included in the data set 10. That is, $D_1$, $D_2$ and $D_3$ shown in FIG. 3 may respectively be a first symbol ($S_1$), a second symbol ($S_2$) and the first symbol ($S_1$), and so forth for the rest data.

Further, it may be assumed that the variable length codes as shown in FIG. 1 (e.g., 1, 01, 001, 0001 and 0000) are determined with respect to each of the symbols (e.g., $S_1$ to $S_5$) included in the data set 10.

The code data 20 corresponding to the data set 10 may then be like those shown in FIG. 4.

That is, the symbols [$S_1$, $S_2$, $S_1$, $S_2$, $S_3$, $S_4$, $S_5$, $S_1$, $S_1$, $S_1$] may be coded into [1, 01, 1, 01, 001, 0001, 0000, 1, 1, 1], respectively. At this time, since the least code is '1', the minimum code length may be 1 bit. Therefore, the coding module 120 may perform the code dividing and storing process that divides each code of [1, 01, 1, 01, 001, 0001, 0000, 1, 1, 1] included in the code data 20 and stores each divided code.

The first partial code may be one high order bit corresponding to '1' that is the minimum code length of each code. That is, the first partial code may be the MSB of each code.

Depending on embodiments, the first partial code may be the most significant 1 bit of each code even when the length of the least code is larger than '1'. That is, the first partial code absolutely may be the most significant 1 bit of each code irrespective of the length of the least code.

In accordance with the technical concept of the embodiments, even in the abovementioned embodiment, loss of the compression rate will not be experienced, since one of the codes (e.g., code 0001) is simply divided into the MSB (e.g., 0) and the rest bits (e.g., 001) and stored. However, when only each MSB of each code is separately divided and each divided MSB is stored, there is high probability that the data having the same value consecutively appear (and this is particularly true for flat area of an image), thus the compression rate may increase.

Then, the first partial code set 30 generated by the coding module 120 may be [1, 0, 1, 0, 0, 0, 0, 1, 1, 1] as shown in FIG. 4. Further, the second partial code set 40 generated by the coding module 120 may be [1, 1, 01, 001, 000] as shown in FIG. 4. It can be identified that the second partial code corresponding to a predetermined code (e.g., the least code) may not exist. That is, for the least code '1', only the first partial code exists and the second partial code may not exist. Therefore, the first of the second partial code '1' of the second partial code set 40 may be the second partial code of the second code (e.g., '01' of $C_2$), and the second partial code of the first code (i.e., '1' of $C_1$) may not be stored in the second partial code set 40. Consequently, the size of the second partial code set 40 may be smaller than that of the code data 20.

As described above, when the code data 20 is divided into the first partial code set 30 and the second partial code set 40 and stored, the coding module 120 may store at least the first partial code set 30. Further, the values of the first partial code ('0' or '1') may be sequentially included in the first partial code set 30 as shown in FIG. 4.

Further, in the first partial code set 30, there may be high probability that the least code (e.g., '1') relatively frequently appears and the least code appears consecutively. Furthermore, the first partial codes of the codes which are not the least code have the same value (e.g., '0'), thus when the first partial code set 30 is compressed, the compression rate may be relatively much higher than that of the case the code data 20 itself is compressed.

In some embodiments of the present invention, the first partial code set 30 and the second partial code set 40 can be obtained directly from the data set 10, given a set of variable length codes for encoding the data set 10.

Further, the coding module 120 may perform the code dividing and storing process on the second partial code set 40 in the same manner described above. This will be described below with reference to FIGS. 7A and 7B.

Figure 7A:
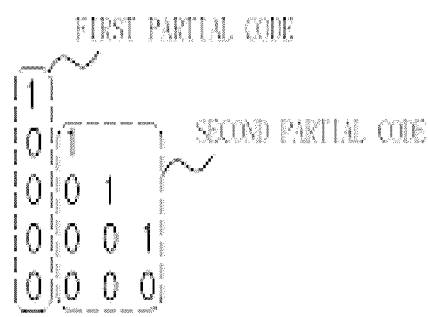
FIGS. 7A and 7B are diagrams provided to explain a concept in which a set of partial codes stored in accordance with an embodiment of the present invention is divided and stored again.
Figure 7B:
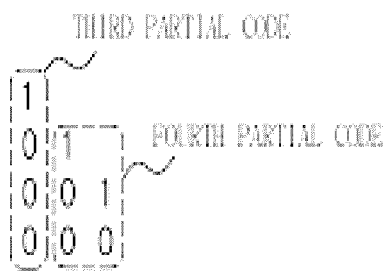

FIGS. 7A and 7B are diagrams provided to explain a concept in which a set of partial codes stored in accordance with an embodiment of the present invention is divided and stored again.

Referring to FIGS. 4, 7A and 7B, when the code dividing and storing process is performed on the code data 20 by the coding module 120, as shown in FIG. 4, the first partial code set 30 and the second partial code set 40 may be generated as a result of the code dividing and storing process. At this time, the variable length codes corresponding to the code data 20 may be as shown in FIG. 7A.

As shown in FIG. 7A, the first partial codes may be included in the first partial code set 30. That is, the first partial codes corresponding to the symbols S1, S2, S3, S4 and S5 may be '1', '0', '0', '0' and '0', respectively. And, the second partial codes corresponding to the symbols S2, S3, S4 and S5 may be '1', '01', '001', and '000', respectively.

Then, if the second partial codes are assumed as the variable length codes corresponding to the second partial code set 40, the code dividing and storing process is performed on the second partial code set 40 in the same manner. Further, as described above, the code dividing and storing process for the second partial code set 40 also may be performed only when the minimum code length of the variable length codes corresponding to the second partial code set 40 is 1. The code dividing and storing process also may be performed even when the minimum code length of the variable length codes is larger than '1' as described above, the MSB of each code and the rest bits may absolutely be divided and stored, as mentioned above.

Since the minimum code length of the variable length codes (e.g., 1, 01, 001, 000) corresponding to the second partial code set 40 is 1 in FIG. 7A, the code dividing and storing process also may be performed on the second partial code set 40.

As shown in FIG. 7B, the second partial codes (e.g., 1, 01, 001, 000) included in the second partial code set 40 may be divided into a third partial code (1, 0, 0, 0) and a fourth partial code (x, 1, 01, 00) to be stored. When the second partial code is '1', the fourth partial code corresponding thereto may not exist as described above.

Then, the second partial code set 40 [1, 1, 01, 001, 000, . . . ] shown in FIG. 4 may be divided into the third partial code set [1, 1, 0, 0, 0, . . . ] and the fourth partial code set [1, 01, 00, . . . ] and the divided third and fourth partial code sets may be stored. Further, when the third partial code set which is set of the third partial codes is compressed, it is possible to obtain more higher compression rate than the case the second partial code set 40 is compressed.

On the other hand, the decoding method for decoding the encoded data using the present invention's encoding method will be described with reference to FIGS. 5 and 6.

Figure 5:
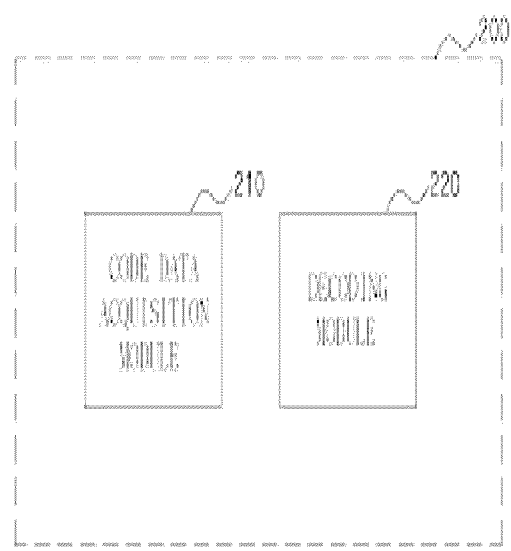
FIG. 5 is a schematic diagram of a decoding system in accordance with an embodiment of the present invention.

FIG. 5 is a schematic diagram of a decoding system in accordance with an embodiment of the present invention. FIGS. 6A to 6F are diagrams for illustrating a method for decoding in accordance with an embodiment of the present invention.

Referring to FIGS. 5 and 6, the decoding system 200 in accordance with an embodiment of the present invention includes a code data acquisition module 210 and a decoding module 220.

The decoding system 200 also may be implemented by a predetermined data processing device (e.g., a computer, a mobile terminal and the like), and may be implemented by combining a hardware provided in the processing device and a predetermined software code defined so that the technical concept can be implemented. The decoding system 200 and the encoding system 100 may be implemented by installing the same software to the data processing device. That is, the encoding system 100 and the decoding system 200 may be implemented at the same time by installing one software (or application) to the data processing device.

The decoding system 200 may perform decoding on the code data set encoded using the encoding system in accordance with an embodiment of the present invention. The code data set includes at least two partial code sets (e.g., 30 and 40), and at least one of the partial code sets (e.g., the first partial code set 30) is compressed (e.g., a zip or the like) and stored.

The code data acquisition module 210 may acquire a code data (e.g., the reference numeral '20' shown in FIG. 3 or FIG. 4). Then, the decoding module 220 may acquire the data set (e.g., 10) by decoding the code data (e.g., 20). The decoding module 220 may decoding with reference to a tree or a table including the variable length codes.

Further, the code data acquisition module 210 may decompress the compassion of the first partial code set 30 which is compressed to be stored in order to acquire the code data (e.g., 20) from the code data set. The second partial code set 40 also may be compress to be stored, and also may be decompressed.

Then, the code data acquisition module 210 may acquire the first partial code from the decompressed first partial code set (e.g., 30) and may acquire the second partial code corresponding to the first partial code from the second partial code set (e.g., 40). Further, a predetermined code included in the code data 20 may be acquired by combining the acquired first and second partial codes.

At this time, the code data acquisition module 210 may acquire the code from only the first partial code, and the second partial code may not exist. In this case, the first partial code may be the least code itself among the variable length codes as described above.

The processes for acquiring the code data from the code data set by the code data acquiring module 210 may be as shown in FIG. 6A to 6F.

FIGS. 6A to 6F are diagrams illustrating processes of decoding the data set which is the encoding is performed as shown in FIG. 4.

Figure 6A:
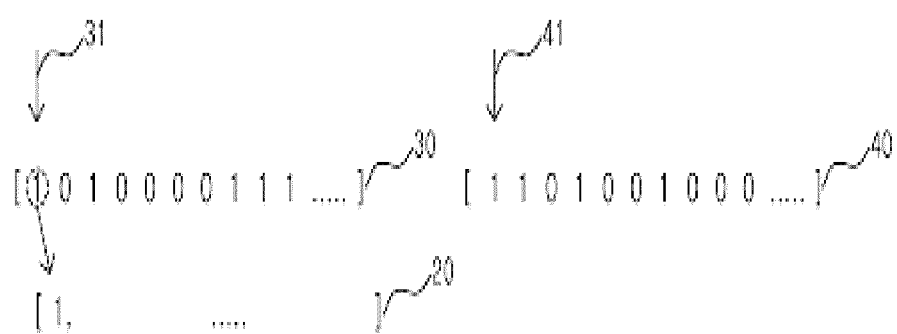
FIGS. 6A to 6F are diagrams for illustrating a method for decoding in accordance with an embodiment of the present invention.

Referring to FIG. 6A, the first partial code set and the second partial code set may be included in the code data set. The first partial code set (e.g., 30) may be compressed and stored, the second partial code set (e.g., 40) also may be compressed and stored depending on the implementation example.

The code data acquiring module 210 may acquire the first partial code set (e.g., 30) and the second partial code set (e.g., 40) shown in FIG. 6A by decompressing the compression thereof. Here, the length of the first partial code of the first partial code set (e.g., 30) may be 1. When the length of the first partial code is larger than 1 (e.g., 2), the code data acquisition module 210 may extract partial code of each bits corresponding to the value (e.g., 2) from the first partial code set (e.g., 30) to generate the code to be included in the code data 20. FIGS. 6A to 6F show the case when the length of the first partial code is 1.

Further, the code data acquiring module 210 may maintain preset pointers 31 and 41 to determine the partial code which is supposed to be extracted from each partial code set 30 and 40.

The first pointer 31 of the first partial code set (e.g., 30) and the second pointer 41 of the second partial code set (e.g., 40) may indicate the values which are supposed to be preferentially extracted from each partial code set. Then, the code data acquiring module 210 may extract the first-first partial code (e.g., 1) from the first partial code set (e.g., 30). The first-first partial code has a value of '1', and said '1' is the least code itself (that is, one of variable length codes), thus, the first-first partial code itself may be a code. Accordingly, the code data acquiring module 210 may not extract any data from the second partial code set (e.g., 40). Then, said '1' is recorded in the code data 20 and may be the first code in the code data 20. Since the partial code is extracted from the first partial code set (e.g., 30), the first pointer 31 may be adjusted to indicate the next partial code. Meanwhile, since the partial code is not extracted from the second partial code set (e.g., 40), the second pointer 41 may not be adjusted.

Figure 6B:
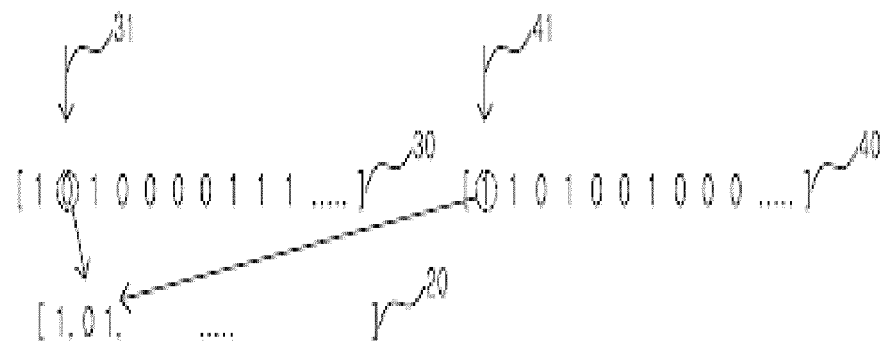

Then, the code data acquiring module 210 may acquire the next code, i.e., the second code. Such processes are shown in FIG. 6B.

The code data acquiring module 210 may extract the second partial code ('0') that the first pointer 31 of the first partial code set (e.g., 30) indicates. Since the second partial code ('0') is not the least code (1') (or (one of variable length codes), the code data acquiring module 210 may extract the value corresponding to the second pointer 41, and then the second pointer 41 may be adjusted to indicate the next partial code.

Then, the code data acquiring module 210 may determine whether combined code, which is combined of the second partial code (0) extracted from the first partial code set (e.g., 30) and the value or bit (1) extracted from the second partial code set (e.g., 40) is one of variable length codes.

The second partial code (0) extracted from the first partial code set (e.g., 30) and the value (1) extracted from the second partial code set (e.g., 40) are combined to be '01', the '01' is included in the variable length codes (shown in FIG. 1). Therefore, the '01' may be determined as the second code of the code data 20.

Figure 6C:
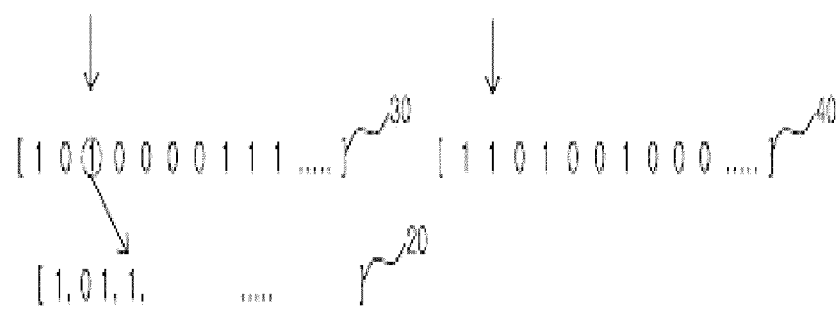

Thereafter, as shown in FIG. 6C, the code data acquiring module 210 may acquire the third code of the code data 20. To this end, the value which the first pointer 31 indicates is extracted, the extracted value is the least code (1), thus no value may be extracted from the second partial code set (e.g., 40). If so, the third code of the code data 20 may be '1'.

Figure 6D:
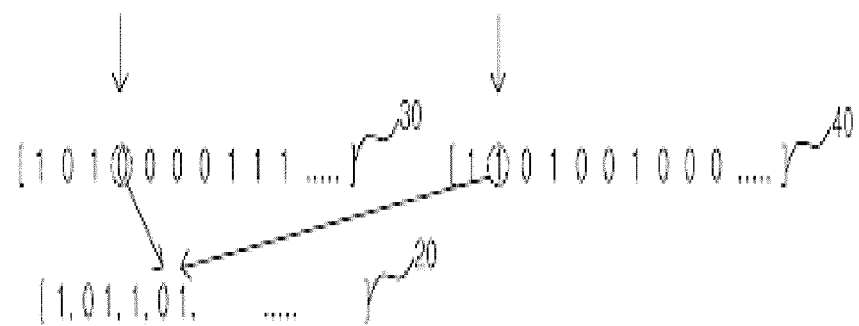

Thereafter, as shown in FIG. 6D, the code data acquiring module 210 may acquire the fourth code of the code data 20. To this end, the value (0) which the first pointer 31 indicates is extracted, the extracted value is not the least code (1), thus the value which the second pointer 41 indicates may be extracted from the second partial code set (e.g., 40). Then, it is possible to determine whether the combined code (01), which is combination of the value (0) extracted from the first partial code set (e.g., 30) and the value (1) extracted from the second partial code set (e.g., 40) is included in the variable length codes. Since the combined code (01) is included in the variable length codes, the combined code (01) may be the fourth code of the code data 20.

Figure 6E:
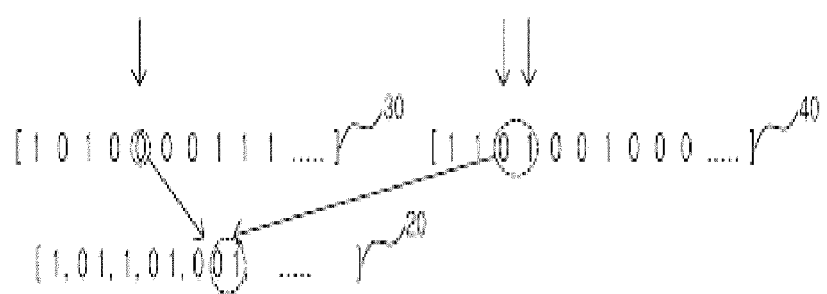

Thereafter, as shown in FIG. 6E, the code data acquiring module 210 may acquire the fifth code of the code data 20. To this end, the value (0) which the first pointer 31 indicates is extracted, the extracted value is not the least code (1), thus the value (0) which the second pointer 41 indicates may be extracted from the second partial code set (e.g., 40). Then, it is possible to determine whether the combined code (00), combination of the value (0) extracted from the first partial code set (e.g., 30) and the value (0) extracted from the second partial code set (e.g., 40), is included in the variable length codes. Since the combined code (00) is not included in the variable length codes, the code data acquisition module 210 may increase the second pointer 41 by 1 to extract the next value or bit (1) of the second partial code set (e.g., 40). Then, it is possible to determine whether the combined code (001) of the extracted values is included in the variable length codes. Since the combined code (001) is included in the variable length codes, the combined code (001) may be the fifth code of the code data 20.

Figure 6F:
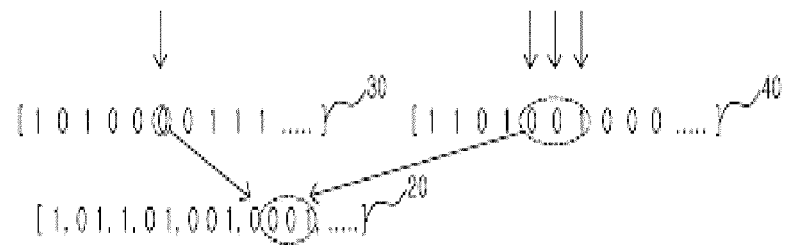

Thereafter, as shown in FIG. 6F, the code data acquiring module 210 may acquire the sixth code of the code data 20. To this end, the value (0) which the first pointer 31 indicates is extracted, the extracted value is not the least code (1), thus the value (0) which the second pointer 41 indicates may be extracted from the second partial code set (e.g., 40). Then, it is possible to determine whether the combination code (00), combination of the value (0) extracted from the first partial code set (e.g., 30) and the value (0) extracted from the second partial code set (e.g., 40), is included in the variable length codes. Since the combined code (00) is not included in the variable length codes, the code data acquisition module 210 may increase the second pointer 41 by 1 to extract one more bit, the next value (0) of the second partial code set (e.g., 40).

Then, it is possible to determine again whether the combined code (000) of the extracted values is included in the variable length codes. Since the combined value (000) is not included in the variable length codes, the code data acquisition module 210 may increase the second pointer 41 by 1 again to extract the next value (1) of the second partial code set (e.g., 40). Then, it is possible to determine whether the combined code (0001) of the extracted values is included in the variable length codes. Since the combined value (0001) is included in the variable length codes, the combined value (0001) may be the sixth code of the code data 20.

In this manner, the code data acquisition module 210 may obtain the code data 20 from the decompressed first partial code set (e.g., 30) and second partial code set (e.g., 40).

In summary, the processes that the code data acquisition module 210 acquires the code data 20 are as follows. The code data acquisition module 210 extracts the value corresponding to the minimum code length, and then if the extracted value is included the variable length codes, the value extracted from the first partial code set (e.g., 30) become the code of the code data 20. If the value extracted from the first partial code set (e.g., 30) is not included in the variable length codes, while extracting a value (or bit) one by one from the second partial code set (e.g., 40), the code data acquisition module 210 may sequentially extract the value in the second partial code set (e.g., 40) until combined code, the combination of the value extracted from the first partial code set (e.g., 30) and the value extracted from the second partial code set (e.g., 40), is included in the variable length codes. Then, if the combined code is included in the variable length codes, the combination code may be the code of the code data 20.

In this manner, the code data acquisition module 210 may acquire the code data (e.g., 20) from the code data set (e.g., 30 and 40). Then, the data set (e.g., 10) may be acquired from the acquired code data (e.g., 20).

Further, as described above, the second partial code set (40) also may be divided into at least two partial code sets (e.g., the third and fourth partial code sets) and the divided partial code sets may be stored. In this case, the code data acquisition module 210 may decompress the compression of the third and/or the fourth partial code sets, may acquire the third partial code which is at least a part of a specific second partial code from the decompressed third partial code set, and acquire the fourth partial code which is the rest part of the specific second partial code from the fourth partial code set. Then, the second partial code may be acquired by combining the acquired the third and the fourth partial codes.

It can be easily understood by anyone who has an ordinary skill in the art that such processes described above also may be performed by the code data acquisition module 210 in the same manner as described in FIGS. 6A to 6F.

That is, the code data acquisition module 210 extracts a value corresponding to the minimum code length from the third partial code set, and if the extracted value is included in the second partial code (e.g., 1, 01, 001, 000 shown in FIG. 7A), the value extracted from the third partial code may be the second partial code.

On the other hand, if the value extracted from the third partial code set in not included in the second partial code, while extracting a value one by one from the fourth partial code set, the code data acquisition module 210 may sequentially extract the value in the fourth partial code set until combined code, the combination of the value extracted from the third partial code set and the value extracted from the fourth partial code set, is included in the second partial code. Then, if the combination code is included in the second partial codes, the combination value may be the second partial code.

In the end, in accordance with the technical concept of the present invention, it can be understood in FIG. 4 to FIG. 6F that even if the code data is divided into at least two partial code sets and the divided partial code sets are stored, the amount of data is substantially the same as the case when the code data itself is stored. Further, the compression rate in at least one of the at least two partial code sets becomes much high so that the overall compression rate of the code data becomes high.

Further, in the embodiment described above (e.g., FIG. 1, 7A or 7B), exemplified is only the case that the difference between the length of the least code (i.e., the code having the minimum code length, e.g., '1') in the variable length codes and that of a second least code (i.e., the code having the minimum code length other than the least code, e.g., '01') is 1. However, even in case that the difference between the length of the least code and that of the second least code is larger than 1, the technical concept of the present invention also may be applied.

Figure 8A:
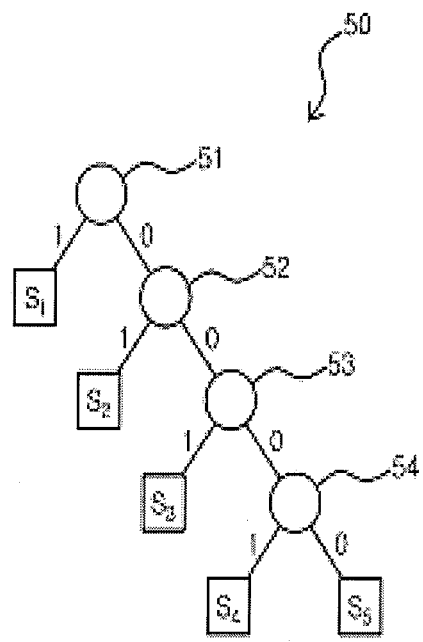
FIGS. 8A and 8B are diagrams illustrating an example that an embodiment of the present invention is applied to the Huffman code.
Figure 8B:
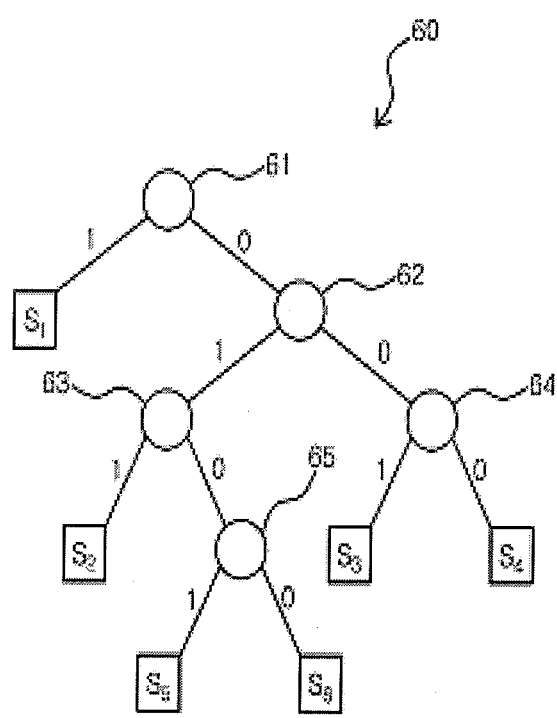

For example, FIGS. 8A and 8B are diagrams illustrating an example that an embodiment of the present invention is applied to the Huffman code. As shown in FIG. 1 or FIG. 7A, FIG. 8A illustrates the Huffman tree that the difference between the length of the least code (e.g., '1' corresponding to the symbol S1) and that of the second least code (e.g., '01' corresponding to the symbol S2) is 1; and FIG. 8B illustrates the Huffman tree that the difference between the length of the least code (e.g., '1' corresponding to the symbol S1) and that of the second least code (e.g., '011', '001', '000' respectively corresponding to the symbols S2, S3, S4) is 2.

Describing the technical concept of the present invention using Huffman tree, the technical concept described above may be applied to the tree 50 (i.e., the tree that the root thereof is node 51). Then, the first partial code set and the second partial code set may be divided in accordance with the technical concept of the present invention. Then, the divided second partial code set may correspond to the first subtree (i.e., the tree that the root is node 52) of the tree 50. As described in FIGS. 7A and 7B, if the technical concept of the present invention is applied to the first subtree, the first subtree may divided into the third partial code set and the fourth partial code set, and the fourth partial code set may correspond to the second subtree (i.e., the tree having a root of node 53).

In this manner, the code dividing and storing process as described above may be applied to the tree corresponding to the entire variable length codes, and then the code dividing and storing process may be selectively applied to the subtree of the tree.

For example, as shown in FIG. 8B, the code dividing and storing process may be performed on the tree 60 i.e., the tree having a root of node 61. Then, each MSB of each code is divided and each divided MSB is stored as a first partial code set, and the rest bits may be stored as the second division code set. The first division code set is a set that only each MSB of the codes is collected, and the length of the least code ($S_1$) is 1. Therefore, the compression rate of the first division code set may be relatively high.

The second partial code set may correspond to the first subtree (i.e., the tree having a root of node 62). The code dividing and storing process may be selectively performed on the first subtree. For example, the MSB is divided from the first subtree and may be stored as the third partial code set and the fourth partial code set. The compression rate of the third division code set may be lower than that of the first partial code set. Further, when the compression rate is not so high, the compression may not be performed. Even if the compression is not performed, each code is divided to be stored as described above and the size of data does not become large. Therefore, no loss may exist in the compression rate.

In this manner, the code dividing and storing process may be selectively performed on each subtree (e.g., each subtree having a root of node 63, node 64 and node 65 and the like).

The method for encoding and decoding in accordance with an embodiment of the present invention may be implemented by computer-readable codes in a computer-readable storage medium.

While the present invention has been described with reference to an embodiment shown in the drawings, this is merely an example and it will be understood to those skilled in the art that various modifications and variations can be made from the above description. Accordingly, the scope of the present invention should be determined by the technical concept of the following claims.

Figure 9:
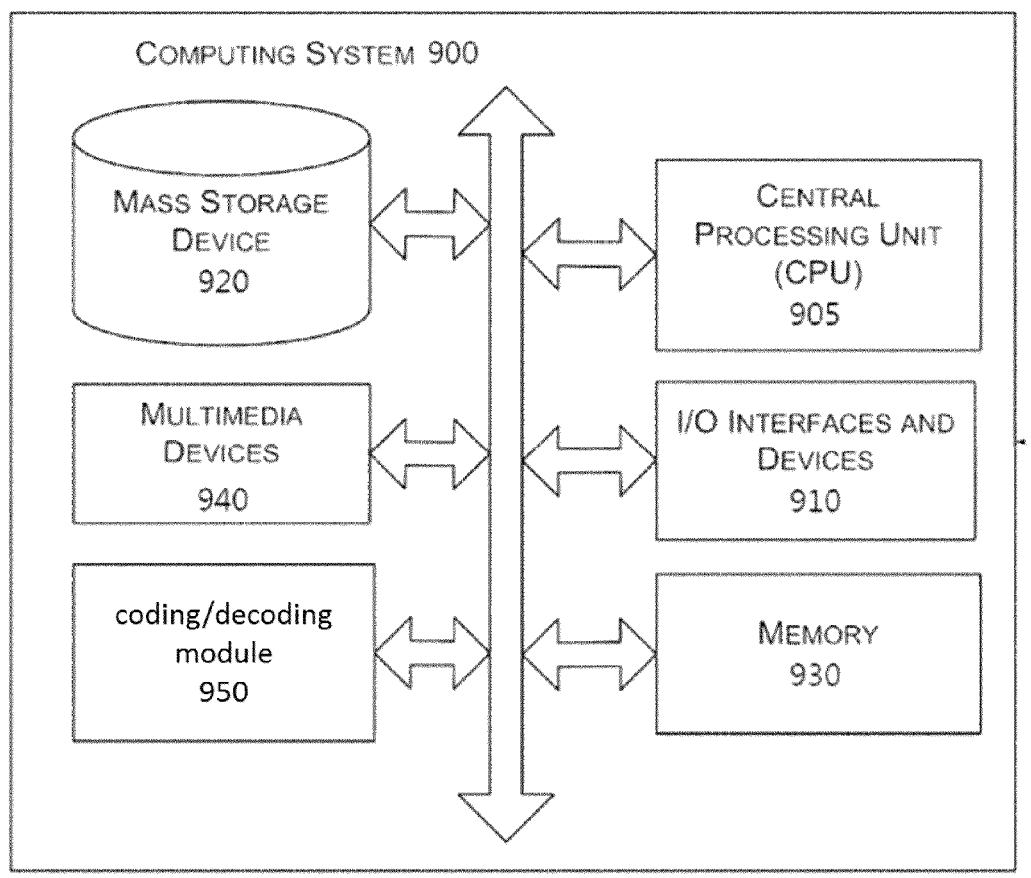
FIG. 9 is a schematic diagram of an computing system in accordance with an embodiment of the present invention.

In some embodiments, any of the systems, servers, or components referenced herein may take the form of a computing system as shown in FIG. 9. FIG. 9 is a block diagram showing one embodiment of a computing system 900. The exemplary computing system 900 includes a central processing unit (CPU) 905, which may include one or more conventional microprocessors that comprise hardware circuitry configured to read computer-executable instructions and to cause portions of the hardware circuitry to perform operations specifically defined by the circuitry. The computing system 900 may also include a memory 930, such as random access memory (RAM) for temporary storage of information and a read only memory (ROM) for permanent storage of information, which may store some or all of the computer-executable instructions prior to being communicated to the processor for execution. The computing system may also include one or more mass storage devices 920, such as a hard drive, diskette, CD-ROM drive, a DVD-ROM drive, or optical media storage device, that may store the computer-executable instructions for relatively long periods, including, for example, when the computer system is turned off. Typically, the modules of the computing system are connected using a standard based bus system. In different embodiments, the standard based bus system could be Peripheral Component Interconnect (PCI), Microchannel, Small Computer System Interface (SCSI), Industrial Standard Architecture (ISA) and Extended ISA (EISA) architectures, for example. In addition, the functionality provided for in the components and modules of computing system may be combined into fewer components and modules or further separated into additional components and modules. The illustrated structure of the computing system 900 may also be used to implement other computing components and systems described in the disclosure. It is recognized that the components discussed herein may be implemented as different types of components. For example, a server may be implemented as a module executing on a computing device or a mainframe may be implemented on a non-mainframe server, a server or other computing device may be implemented using two or more computing devices, and/or various components could be implemented using a single computing devices.

In one embodiment, the computing system 900 comprises a server, a workstation, a mainframe, and a minicomputer. In other embodiments, the system may be a personal computer that is IBM, Macintosh, or Linux/Unix compatible, a laptop computer, a tablet, a handheld device, a mobile phone, a smart phone, a personal digital assistant, a car system, or a tablet. The servers may include a variety of servers such as database servers (for example, Oracle, DB2, Informix, Microsoft SQL Server, MySQL, or Ingres), application servers, data loader servers, or web servers. In addition, the servers may run a variety of software for data visualization, distributed file systems, distributed processing, web portals, enterprise workflow, form management, and so forth.

The computing system 900 may be generally controlled and coordinated by operating system software, such as Windows 95, Windows 98, Windows NT, Windows 2000, Windows XP, Windows Vista, Windows 7, Windows 8, Unix, Linux, SunOS, Solaris, Maemeo, MeeGo, BlackBerry Tablet OS, Android, webOS, Sugar, Symbian OS, MAC OS X, or iOS or other operating systems. In other embodiments, the computing system 900 may be controlled by a proprietary operating system. Conventional operating systems control and schedule computer processes for execution, perform memory management, provide file system, networking, I/O services, and provide a user interface, such as a graphical user interface (GUI), among other things.

The computing system 900 includes one or more commonly available input/output (I/O) devices and interfaces 910, such as a keyboard, mouse, touchpad, speaker, microphone, or printer. In one embodiment, the I/O devices and interfaces 910 include one or more display device, such as a touchscreen, display or monitor, which allows the visual presentation of data to a user. More particularly, a display device provides for the presentation of GUIs, application software data, and multimedia presentations, for example. The central processing unit 905 may be in communication with a display device that is configured to perform some of the functions defined by the computer-executable instructions. For example, some of the computer-executable instructions may define the operation of displaying to a display device, an image that is like one of the screenshots included in this application. The computing system may also include one or more multimedia devices 940, such as speakers, video cards, graphics accelerators, and microphones, for example. A skilled artisan would appreciate that, in light of this disclosure, a system including all hardware components, such as the central processing unit 905, display device, memory 930, and mass storage device 920 that are necessary to perform the operations illustrated in this application, is within the scope of the disclosure.

In the embodiment of FIG. 9, the I/O devices and interfaces provide a communication interface to various external devices and systems. The computing system may be electronically coupled to a network, which comprises one or more of a LAN, WAN, the Internet, or cloud computing networks, for example, via a wired, wireless, or combination of wired and wireless, communication link. The network communicates with various systems or other systems via wired or wireless communication links.

Information may be provided to the computing system 900 over a network from one or more data sources. The network may communicate with other data sources or other computing devices. The data sources may include one or more internal or external data sources. In some embodiments, one or more of the databases or data sources may be implemented using a relational database, such as Sybase, Oracle, CodeBase and Microsoft® SQL Server as well as other types of databases such as, for example, a flat file database, an entity-relationship database, and object-oriented database, or a record-based database.

In the embodiment of FIG. 9, the computing system 900 also includes a coding/decoding module 950, which may be executed by the CPU 905, to run one or more of the processes discussed herein. This module may include, by way of example, components, such as software components, object-oriented software components, class components and task components, processes, functions, attributes, procedures, subroutines, segments of program code, drivers, firmware, microcode, circuitry, data, databases, data structures, tables, arrays, or variables. In one embodiment, the coding/decoding module 950 corresponds to the coding module 120 and/or the decoding module 220.

Embodiments can be implemented such that all functions illustrated herein are performed on a single device, while other embodiments can be implemented in a distributed environment in which the functions are collectively performed on two or more devices that are in communication with each other. Moreover, while the computing system has been used to describe one embodiment of the encoding system 100 and/or the decoding system 200, it is recognized that the user systems may be implemented as computing systems as well.

In general, the word "module," as used herein, refers to logic embodied in hardware or firmware, or to a collection of software instructions, possibly having entry and exit points, written in a programming language, such as, for example, Java, Lua, C or C++. A software module may be compiled and linked into an executable program, installed in a dynamic link library, or may be written in an interpreted programming language such as, for example, BASIC, Perl, or Python. It will be appreciated that software modules may be callable from other modules or from themselves, or may be invoked in response to detected events or interrupts. Software instructions may be embedded in firmware, such as an EPROM. It will be further appreciated that hardware modules may be comprised of connected logic units, such as gates and flip-flops, or may be comprised of programmable units, such as programmable gate arrays or processors. The modules described herein are preferably implemented as software modules, but may be represented in hardware or firmware. Generally, the modules described herein refer to logical modules that may be combined with other modules or divided into sub-modules despite their physical organization or storage.

It is recognized that the term "remote" may include systems, data, objects, devices, components, or modules not stored locally, that are not accessible via the local bus. Thus, remote data may include a system that is physically stored in the same room and connected to the computing system via a network. In other situations, a remote device may also be located in a separate geographic area, such as, for example, in a different location, country, and so forth.

Each of the processes, methods, and algorithms described in the preceding sections may be embodied in, and fully or partially automated by, code modules executed by one or more computer systems or computer processors comprising computer hardware. The code modules may be stored on any type of non-transitory computer-readable medium or computer storage device, such as hard drives, solid-state memory, optical disc, and/or the like. The systems and modules may also be transmitted as generated data signals (for example, as part of a carrier wave or other analog or digital propagated signal) on a variety of computer-readable transmission mediums, including wireless-based and wired/cable-based mediums, and may take a variety of forms (for example, as part of a single or multiplexed analog signal, or as multiple discrete digital packets or frames). The processes and algorithms may be implemented partially or wholly in application-specific circuitry. The results of the disclosed processes and process steps may be stored, persistently or otherwise, in any type of non-transitory computer storage such as, for example, volatile or non-volatile storage.

In addition, it is recognized that a feature shown in one figure may be included in a different display or interface, module, or system. Also, the reference numbers listed in the description are hereby incorporated by reference into the figures and the corresponding elements of the figures are deemed to include the corresponding reference numbers from the description.

The various features and processes described above may be used independently of one another, or may be combined in various ways. All possible combinations and sub-combinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Conditional language, such as, among others, "can," "could," "might", or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment. The term "including" means "included but not limited to". The term "or" means "and/or".

Any process descriptions, elements, or blocks in the flow or block diagrams described herein and/or depicted in the attached figures should be understood as potentially representing modules, segments, or portions of code which include one or more executable instructions for implementing specific logical functions or steps in the process. Alternate implementations are included within the scope of the embodiments described herein in which elements or functions may be deleted, executed out of order from that shown or discussed, including substantially concurrently or in reverse order, depending on the functionality involved, as would be understood by those skilled in the art.

All of the methods and processes described above may be embodied in, and partially or fully automated via, software code modules executed by one or more general-purpose computers. For example, the methods described herein may be performed by the computing system and/or any other suitable computing device. The methods may be executed on the computing devices in response to execution of software instructions or other executable code read from a tangible computer readable medium. A tangible computer readable medium is a data storage device that can store data that is readable by a computer system. Examples of computer readable mediums include read-only memory, random-access memory, other volatile or non-volatile memory devices, CD-ROMs, magnetic tape, flash drives, and optical data storage devices.

It should be emphasized that many variations and modifications may be made to the above-described embodiments, the elements of which are to be understood as being among other acceptable examples. All such modifications and variations are intended to be included herein within the scope of this disclosure. The foregoing description details certain embodiments. It will be appreciated, however, that no matter how detailed the foregoing appears in text, the systems and methods can be practiced in many ways. For example, a feature of one embodiment may be used with a feature in a different embodiment. As is also stated above, it should be noted that the use of particular terminology when describing certain features or aspects of the systems and methods should not be taken to imply that the terminology is being re-defined herein to be restricted to including any specific characteristics of the features or aspects of the systems and methods with which that terminology is associated.

What is claimed is:

1. A method of encoding, comprising:
providing data comprising plurality of data sets, which are arranged to form a sequence of data sets;
providing a plurality of codes comprising a first code having the shortest code length, the plurality of codes further comprising longer codes that are longer than the first code, wherein each of the longer codes comprises a leading portion and a trailing portion, wherein the leading portion is in the same length as the first code, wherein the trailing portion is the remainder following the leading portion in each of the longer codes;
assigning to each data set, one of the plurality of codes to form a first sequence of codes representing the sequence of data sets, wherein the first code is assigned to the most repeated data set in the sequence of data sets;
generating a second sequence using the first code and the leading portions of the longer codes appearing in the first sequence, in which for a longer code in the first sequence, a leading portion of the longer code enters in the second sequence and, for the first code in the first sequence, the same first code enters in the second sequence, wherein the first code and the leading portions in the second sequence are arranged in an order in which each of the first code and the leading portions in the second sequence sequentially corresponds to each code of the first sequence of codes; and
compressing the second sequence using a data compression software module.

2. The method of claim 1, further comprising:
generating a third sequence using the trailing portions of the longer codes appearing in the first sequence, wherein the trailing portions in the second sequence are arranged in an order in which each of the trailing portions in the second sequence sequentially corresponds to each longer code of the first sequence of codes, wherein each trailing portion appearing in the second sequence sequentially corresponds to a longer code of the first sequence that the leading portion originates.

3. The method of claim 1, wherein each data set represents a portion of an image, wherein the most repeated data set is a data set that is most frequently appearing in the sequence of data sets, wherein each code in the second sequence sequentially corresponds to each code of the first sequence such that a code at a relative position in the first sequence of codes corresponds to a code at the same relative position in the second sequence of codes.

4. The method of claim 1, wherein the plurality of codes further comprising a second code that is in the same code length as the first code, wherein the second code is assigned to one of the plurality of data sets in the first sequence of data set.

5. The method of claim 4, wherein the second code is assigned to the second most repeated data set in the sequence of data sets.

6. A computer program stored in a computer readable recording medium in which the program is for executing the method of claim 1.

7. A method for encoding data using a variable length coding, the method comprising:
a) at an encoding system, determining variable length codes for coding a data set to be encoded;
b) at the encoding system, dividing a corresponding code, which is one of the variable length codes, corresponding to a specific data included in the data set into a first partial code and a second partial code and storing the divided first and second partial codes; and
c) at the encoding system, compressing a first partial code set, which is a set of the first partial code, and storing the compressed result.

8. The method of claim 7, wherein the first partial code is at least a part of the corresponding code, which corresponds to a length of a least code having a minimum code length among the variable length codes.

9. The method of claim 7, wherein the first partial code is a most significant 1 bit of the code.

10. The method of claim 7, further comprising:
when determining the variable length codes, at the encoding system, determining whether a minimum code length is a predetermined reference length or not; and
performing the steps b) and c) only when a result of the determining indicates that the minimum code length is the reference length.

11. The method of claim 7, wherein the step b) further comprises:
- At the encoding system, dividing the second partial code included in the second partial code set into a third partial code and a fourth partial code and storing the divided partial codes; and
- compressing and storing a third partial code set of the third partial code.

12. A computer program stored in a computer readable recording medium in which the program is for executing the method of claim 7.

* * * * *